United States Patent
Ryu et al.

(10) Patent No.: US 9,363,883 B2
(45) Date of Patent: Jun. 7, 2016

(54) PRINTED CIRCUIT BOARD AND METHOD FOR MANUFACTURING SAME

(75) Inventors: Sung Wuk Ryu, Seoul (KR); Seong Bo Shim, Seoul (KR); Seung Yul Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 280 days.

(21) Appl. No.: 13/997,420

(22) PCT Filed: Dec. 23, 2011

(86) PCT No.: PCT/KR2011/010058
§ 371 (c)(1),
(2), (4) Date: Sep. 19, 2013

(87) PCT Pub. No.: WO2012/087073
PCT Pub. Date: Jun. 28, 2012

(65) Prior Publication Data
US 2014/0000951 A1 Jan. 2, 2014

(30) Foreign Application Priority Data

Dec. 24, 2010 (KR) .......................... 10-2010-0134543
May 31, 2011 (KR) .......................... 10-2011-0052487

(51) Int. Cl.
  H05K 7/10 (2006.01)
  H05K 7/12 (2006.01)
  H05K 1/02 (2006.01)
  H05K 3/40 (2006.01)
  H05K 3/34 (2006.01)

(52) U.S. Cl.
  CPC .. *H05K 1/02* (2013.01); *H05K 3/40* (2013.01); *H05K 3/4007* (2013.01); *H05K 3/3436* (2013.01); *H05K 3/3452* (2013.01); *H05K 2201/0367* (2013.01)

(58) Field of Classification Search
  USPC .......................................... 361/767; 174/261
  See application file for complete search history.

(56) References Cited

U.S. PATENT DOCUMENTS

| 2002/0149118 | A1 | 10/2002 | Yamaguchi et al. |
| 2006/0163725 | A1 | 7/2006 | Haba et al. |
| 2006/0252248 | A1 | 11/2006 | Hu |
| 2007/0186412 | A1 | 8/2007 | Hsu et al. |
| 2008/0314633 | A1 | 12/2008 | Kang et al. |
| 2009/0052150 | A1 | 2/2009 | Kobayashi |

FOREIGN PATENT DOCUMENTS

| CN | 101754592 A | 6/2010 |
| JP | 2002261111 A | 9/2002 |
| JP | 2003-142811 A | 5/2003 |

(Continued)

OTHER PUBLICATIONS

Office Action dated Sep. 6, 2015 in Chinese Application No. 201180068544.6.

(Continued)

*Primary Examiner* — Andargie M Aychillhum
(74) *Attorney, Agent, or Firm* — Saliwanchik, Lloyd & Eisenschenk (57) ABSTRACT

A printed circuit board according to an embodiment of the present invention includes an insulating layer, a pad formed on the insulating layer and exposed through an opening section of a solder resist, a bump formed by filling an opening portion of the solder resist from top of the pad and having an narrow width than the opening of the solder resist.

13 Claims, 6 Drawing Sheets

(56) References Cited

FOREIGN PATENT DOCUMENTS

| | | | |
|---|---|---|---|
| JP | 2003198085 A | 7/2003 | |
| JP | 2005108941 A | 4/2005 | |
| JP | 2006210565 A | 8/2006 | |
| JP | 2007-214534 A | 8/2007 | |
| JP | 2009004744 A | 1/2009 | |
| JP | 2011-054965 A | 3/2011 | |
| JP | 2012-054295 A | 3/2012 | |
| KR | 10-2007-0010451 A | 1/2007 | |
| KR | 10-2007-0013633 A | 1/2007 | |
| KR | 10-2009-0021076 A | 2/2009 | |
| KR | 10-2009-0099288 A | 9/2009 | |
| KR | 10-2010-00012370 A | 2/2010 | |
| KR | 10-2011-0128532 A | 11/2011 | |
| KR | 10-2012-0031727 A | 4/2012 | |
| TW | 200803660 A | 1/2008 | |
| TW | 200938022 A | 9/2009 | |
| WO | WO 2010046235 A1 * | 4/2010 | ............... C25D 3/32 |

OTHER PUBLICATIONS

International Search Report in International Application No. PCT/KR2011/010058, filed Dec. 23, 2011.

Notice of Allowance dated Aug. 27, 2012 in Korean Application No. 10-2010-0134543, filed Dec. 24, 2010.

Notice of Allowance dated Nov. 20, 2012 in Korean Application No. 10-2011-0052487, filed May 31, 2011.

Office Action dated Dec. 23, 2011 in Korean Application No. 10-2010-0134543, filed Dec. 24, 2010.

Office Action dated Jun. 20, 2012 in Korean Application No. 10-2011-0052487, filed May 31, 2011.

Office Action dated Aug. 30, 2013 in Taiwanese Application No. 100148570, filed Dec. 26, 2011.

Office Action dated Sep. 29, 2015 in Japanese Application No. 2013-546035.

* cited by examiner

PRINTED CIRCUIT BOARD AND METHOD FOR MANUFACTURING SAME

CROSS-REFERENCE TO RELATED APPLICATIONS

This application is the U.S. national stage application of International Patent Application No. PCT/KR2011/010058, filed Dec. 23, 2011, which claims priority to Korean Application Nos. 10-2010-0134543, filed Dec. 24, 2010, and 10-2011-0052487, filed May 31, 2011, the disclosures of each of which are incorporated herein by reference in their entirety.

BACKGROUND

The present invention relatives to a printed circuit board and a method for manufacturing the same.

The printed circuit board (PCB) refers to print the circuit pattern on an electrical insulating substrate using a conductive materials such as copper, particularly means a board just before mounting electronic components.

That is, in order to densely mount various types of electronic elements on a flat panel, the printed circuit board means a circuit board for confirming a mounting location of each part, printing and fixing the circuit pattern connected to the part on the flat panel A demand for a high performance, a compact, a cost-competitive and a period for payment in an electronics industry increases according to a development of the electronics industry. In response to these trends, a printed circuit board companies achieves a thin and densification of the printed circuit board using semi additive process (SAP).

Figure 1A:
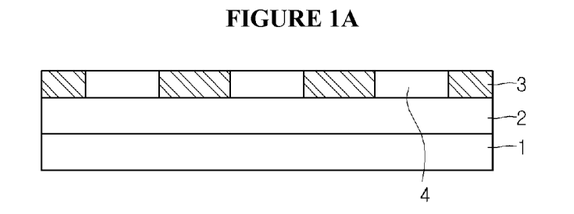

FIG. 1a. to 1e are a cross-section showing a bump manufacturing process in a typical printed circuit board.

First, a first metal layer 2 is formed on insulation board (an insulating plates 1 as shown in FIG. 1a.

In addition, the first metal layer 2 may be made of copper, nickel or an ally thereof.

If the first metal layer 2 is formed, a first mask pattern is formed on the first metal layer 2.

Figure 1B:
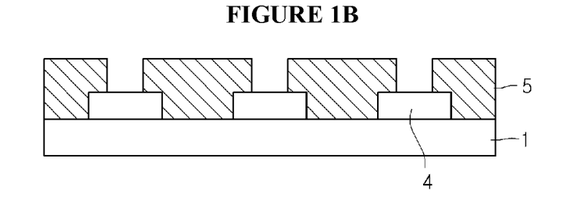

And then, the pad 4 is formed by electroplating the first metal layer 3 using first metal layer 2 as seed layer, centering on the first mask pattern Then, a pad 4 is formed by electrolytic plating a first metal layer as a seed layer around the formed first mask pattern 3.

When the pad 4 is formed, an unnecessary part 2, for example the first metal layer 2 and a first mask pattern 3 is removed through a peeling and etching process.

Then, a solder resist 5 exposing the formed pad 4 is formed on the insulating substrate 1 formed with the pad 4.

Figure 1C:
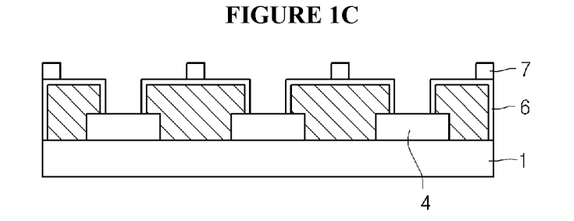

Then, the second metal layer 6 is formed on the doped solder resist 5 as shown in FIG. 1c and a second mask pattern 7 is formed on the formed second metal layer 6.

In this case, a surface treatment of the solder resist 5 is performed to ensure adhesion force between the sold resist 5 and the second metal layer 6.

Figure 1D:
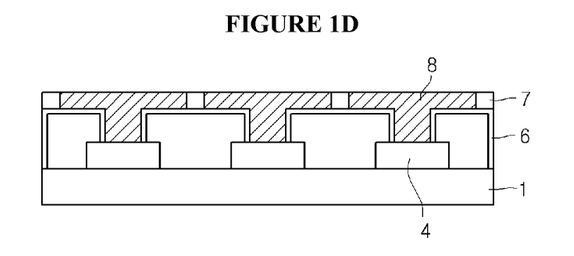
Figure 1E:
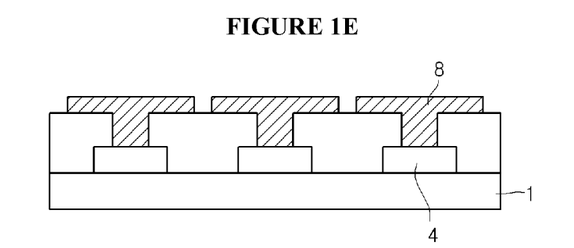

After this, as shown in FIG. 1d, a bump 8 is formed on the pad 4 and then the unnecessary parts, for example the second metal layer 6 and the second mask pattern 7 are removed through the peeling and etching process as shown in FIG. 1e.

According to the prior art, a diameter of the bump 8 is formed larger than opening section of the solid resist 5.

However, as described above, when the bump is formed, an interval between neighboring bumps becomes narrow, so that it is highly likely that a bad connection will occur

BRIEF SUMMARY

The present embodiment is to provide a printed circuit board and a method for manufacturing the same capable of minimizing an interference between adjacent bumps.

The embodiment is to provide a printed circuit board and a method for manufacturing the same having a novel bump shape.

A technical problem for being resolved by the present invention is not limited to the above-mentioned problem and those having the art will be clearly understand that there are other problems that are not mentioned above through the following description.

A printed circuit board according to a embodiment of then present invention includes an insulating layer; a pad formed on the insulating layer and exposed through an opening section of a solder resist; a bump formed on the pad and filling the opening section of the solder resist and having an narrow width than the opening section of the solder resist.

In addition, the bump fills the opening section of the solder resist and protrudes from a surface of the solder resist in a predetermined height.

In addition, the printed circuit board further includes a bump connection section formed between the pad and the bump to electrically connect the pad and the bump section.

Furthermore, the bump is formed narrower than the width of an upper surface of the bump connection section.

Moreover, the bump has a narrow width than an upper surface of the pad and the bump is formed such that a width of the upper surface thereof and a lower surface opposite the upper surface is equal.

In addition, the bump of the printed circuit board has a square pillar in shape.

Moreover, the bump of the printed circuit board is made of alloy containing copper.

Meanwhile, a method for manufacturing a print circuit board according to a embodiment of the present invention includes forming a pad on an insulating substrate; applying a solder resist having an opening section exposing the formed pad on the insulating substrate; forming a mask having a window for opening of the opening section of the solder resist on the solder resist; and forming a bump for filling a portion of the opening of the solder resist and the window by performing a plating.

In addition, in a manufacturing method of the printed circuit board, the pad is formed by etching or plating process.

Moreover, the manufacturing method of the printed circuit board further includes forming a bump connecting section electrically connecting the pad and the bump by performing the plating.

In addition, the method further comprises forming a bump connecting section for electrically connecting of the pad and the bump by performing the plating.

In addition, forming the mask on the solder resist comprises forming the mask having the window of narrow width than opening section of the solder resist.

In addition, the forming the bump comprises forming the bump having a narrow width than the upper surface of the formed pad.

Moreover, forming the bump comprises forming the bump such that the width of the upper surface and a lower surface opposite the upper surface is equal.

In addition, the bump is a cylinder pillar, a square pillar and a polygonal pillar in shape.

Moreover, a manufacturing method of the printed circuit board further includes forming solder for filling the window on the formed bump.

In addition, the method further comprises forming solder for filling the window on the formed bump.

BRIEF DESCRIPTION OF THE DRAWINGS

FIG. 1a to 1e is a cross-section showing a method for manufacturing the printed circuit board of the prior art.

FIGS. 3 to 12 is a cross-section showing a manufacturing method of a printed circuit board according to an embodiment of the present invention.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

A printed circuit board according to an embodiment of the present invention will be described with reference to FIGS. 2 to 14.

Figure 2:
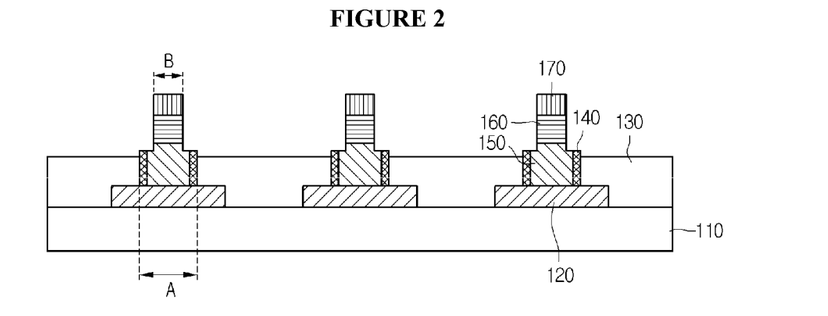
FIG. 2 is a cross-section of a printed circuit board according to an embodiment of the present invention.

FIG. 2 is a cross-section of the printed circuit board according to an embodiment of the present invention.

The invention provides to an economic and reliable circuit board to use a seed layer to form a circuit pattern on an insulating layer and to use the same seed layer as the seed layer used at the time of the formation of the circuit pattern to form a bump on the circuit pattern.

Referring to FIG. 2, the printed circuit board 100 according to an embodiment of the present invention includes an insulating plate 110, a pad 120 connected to a circuit pattern (not shown) formed on the insulating plate 110, a solder resist 130 covering the pad 120 and the circuit pattern; a plating seed layer 140 formed in an inner wall of the solder resist 130, a bump connection section 150 formed in the pad 120 to fill the opening section 135 of the solder resist 130, a bump 160 formed on the bump connection section and a solder formed on the bump.

The insulting plate 110 may a support plate of the printed circuit board 100 formed with single circuit pattern, but can mean insulating layer formed with a circuit pattern (not shown) of the printed circuit board having a plurality of a stack structures.

When the insulating plate 100 means one insulating layer of a plurality of stack layer structures, a plurality of circuit patterns (not shown) are successively formed at an upper portion or a lower portion of the insulating plate 110.

The insulating plate 100 may be a thermosetting or thermoplastic polymer substrate, a ceramic substrate, organic-inorganic composite material substrate or glass fibers impregnated substrate and if the insulating plate includes a polymer resin, this may contains epoxy insulating resin, otherwise may contain polyimid resin.

The plurality of pads 120 capable of connecting to a plurality of circuit patterns is formed on the insulating plate 110. The pad 120 is a bump mounted on the printed circuit board 100 and means a pad 120 attached with the solder 170.

The pad 120 is made of a conductive material and may be made of alloy containing copper if a copper thin layer formed on the insulating plate 110 is pattered to form the circuit pattern, In addition, the pad 120 may be formed by selectively removing the plating layer formed on the insulating plate 110 by a non-electrolytic plating.

The circuit pattern is covered on the insulating plate 110 and the solder resist 130 is formed.

The solder resist 130 serves to protect the surface of the insulating plate 110 and has an opening portion 135 for opening an upper surface of the pad 120 to be exposed.

The plating seed layer 140 is formed at a side surface of the formed solder resist 130.

The plating seed layer 140 is formed at a side surface of the opening section 135 of the solder resist 130 to be exposed.

The plating seed layer 140 is a seed for forming the bump connection section formed on the plating seed layer 150 and may an alloy having a high adhesion to copper as copper or nickel if bump connection 150 is made of copper.

In addition, the plating seed layer 140 may be on the solder resist 130 formed by chemical copper plating.

The opening section 135 of the solder resist 130 is filled on the plating seed layer 140 and the bump connection 150 is formed.

The bump connection 150 is formed to be protruded from the upper surface of the solder resist 130 and may be formed at the same height as the upper surface of the solder resist 130.

The bump connection 150 may be formed by the electrolytic copper plating using seed layer 140 as seed.

The bump connection 150 may be formed by performing electro clad plating using the seed layer 140 as a seed.

The bump connection 150 may be formed by performing the electrolytic copper plating the seed layer 140 as a seed.

The bump 160 is formed on the bump connection 150.

The bump 160 is formed to protrude from the upper surface of the solder resist 130.

In this case, the bump 160 is formed in at least any one of shape of cylinder pillars, a square pillars and motile pillars, which a width of the upper surface and the lower surface opposite the upper surface is the same.

That is, the bump 160 has a shape of the square pillar 130 and is formed to protrude from the upper surface of the solder resist to easily perform a formation of solder 170.

In this case, the bump 160 is formed at an inner side of the opening section 135 of the solder resist 130 and is formed to have a narrow width than the opening section 135 of the solder resist 130.

That is, as shown in FIG. 1, when the width of the opening section 135 of the solder resist 130 is A, the bump is formed to have a narrow width B than the width A.

According to the prior art, the bump is formed such that an area protruding from the solder resist 130 is expanded to have a larger width than the opening section 135.

In this case, when the bump is formed as described above, the solder formed on the bump is formed to have the width greater than the opening section, so that an interval between adjacent solders become narrow, thereby causing the bad connection due to a contact between the solders.

Therefore, in the present invention, the width of the bump 160 is formed narrow than the width solder resist 130 and the solder 170 is formed at the same width as the width of the solder resist, thereby maximizing the interval between adjacent solders.

The solder 170 is formed on the bump 160. The solder 170 has a round shape by a surface tension by reflowing and melting to contact with the element.

The solder 170 includes more than binary metal and the binary metal is alloy containing Sn, specifically, an alloy containing Sn—Cu.

The printed circuit board 100 forms a narrow width of the bump 160 than that of the opening section of the solder resist.

In the printed circuit board 100 according to a embodiment of the present invention, the width of the bump 160 is formed narrower than that of the opening section 135 included in the solder resist 180, so that the adjacent solder between the interval is maximized, thereby preventing a bad connection caused by the contact between the adjacent solders.

FIGS. 3 to 13 is a cross-section showing a method for manufacturing the printed circuit board 100 according to an embodiment of the present invention.

Figure 3:
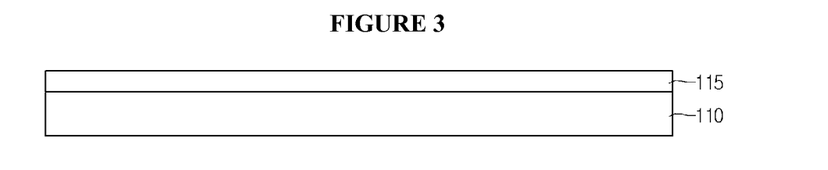

First, the metal layer 115 is formed at insulating plate 110 as described in FIG. 3.

In this case, the metal layer 115 may be formed by the non-electrolyte plating of the metal including copper on the insulating plate 110.

The insulating plate 100 may be a thermosetting or thermoplastic polymer substrate, a ceramic substrate, organic-inorganic composite material substrate or glass fibers impregnated substrate and if the insulating plate includes a polymer resin, this may contains epoxy insulating resin, otherwise may contain polyimid resin.

In addition, the metal 115 may use copper clad laminate (CCL) unlike the method for forming the metal layer on the insulating plate 110 by the non-electrolyte plating.

Moreover, if the metal layer 115 is formed by the non-electrolyte plating, the plating may be performed smoothly by providing the top of surface roughness of an insulating plate 110.

Figure 4:
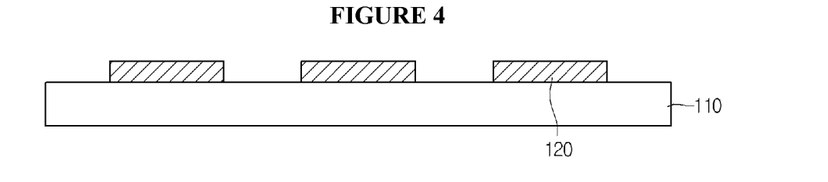

Subsequently, as shown in FIG. 4, a conductive layer 115 forming on the insulating plate 110 is selectively removed to form the circuit pattern (not shown) or the pad 120.

In this case, the conductive layer 115 forming in the insulating plate may be formed at upper surface of the insulating plate 110 and an lower portion of the insulating plate 110 and therefore the circuit pattern (not shown) and the pad 120 may also formed at the lower surface.

Figure 5:
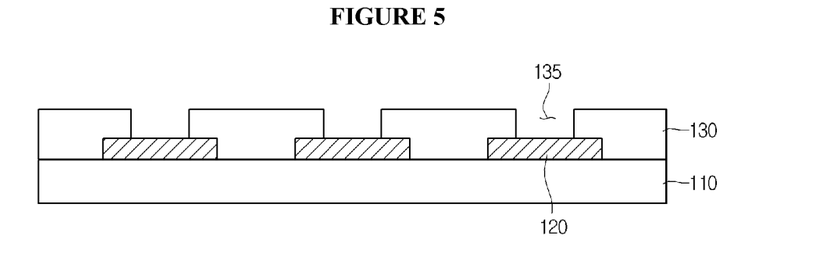

Thus, the circuit pattern and pad 120 is formed in at least one side of the insulating plate 110 and the solder resist 130 to fill the formed circuit pattern to the insulating plate 110 is coated as shown in FIG. 5.

In this case, the solder resist 130 is formed to include the opening section 135 exposing the pad 120 and the opening section 135 is formed to have a narrow width than the pad 120, so that the edge area of the pad 120 is protected by the solder resist 130.

Figure 6:
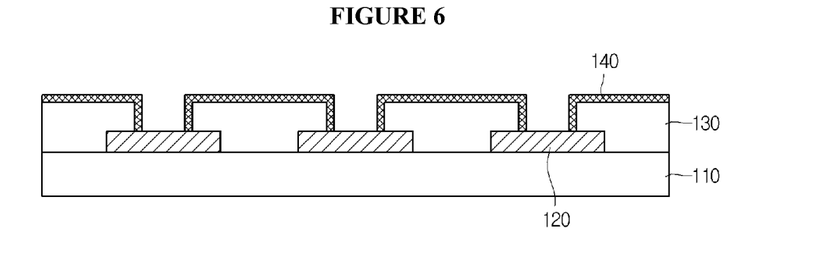

Subsequently, the plating seed layer 140 covering the upper surface and the side surface of the forming solder resist is formed as shown in FIG. 6.

The plating seed layer 140 may be formed by an electroless plating scheme.

The non-electrolyte plating method performs a degreasing process, soft-corrosion process, pre-catalytic process, a catalytic process, a activation process, an electroless plating process and an oxidation preventing process in the orders.

In addition, the plating seed layer 140 may be formed by using a plasma rather than a metal particles.

In this case, a des-smear process to remove a smear of the surface of the solder resist is additionally performed prior to plating the plating seed layer 140.

The des-smear process provides the surface roughness to the surface of solder resist 130 to provide a high plating strength of the plating seeding layer 140.

In addition, the plating seed layer 140 is formed at the upper surface of the pad 120 in addition to the upper surface and the side surface of the solder resist 130.

Figure 7:
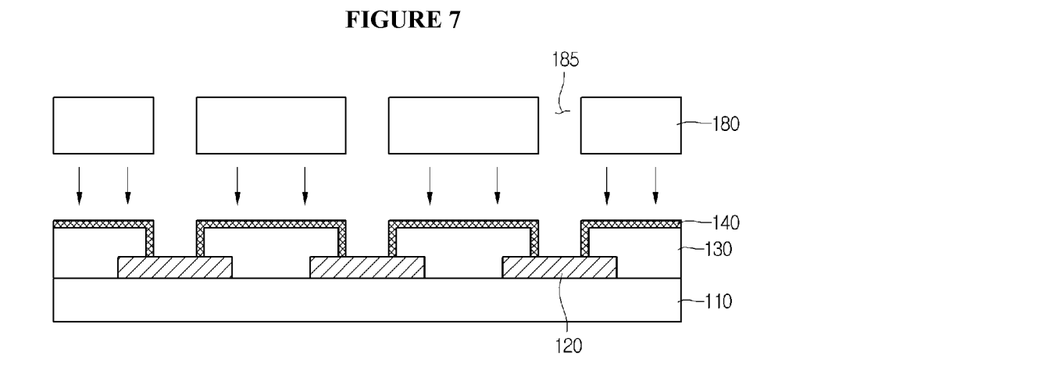

Next, the mask 180 having the window for opening a portion of the solder resist opening section 185 is formed as shown in FIG. 7.

More preferably, the mask 180 has a window 185 opening the area formed with a bump connection 150, bump 160 and a solder 70.

The mask 180 preferably uses a heat-resistant dry film.

In this case, the window 185 formed on the mask has a narrow width than the opening section 135 included in the solder resist 130.

On the other hand, the window 185 of the mask 180 is formed in the opening section 135 formed in the solder resist to open only a portion of the opening 135.

Figure 8:
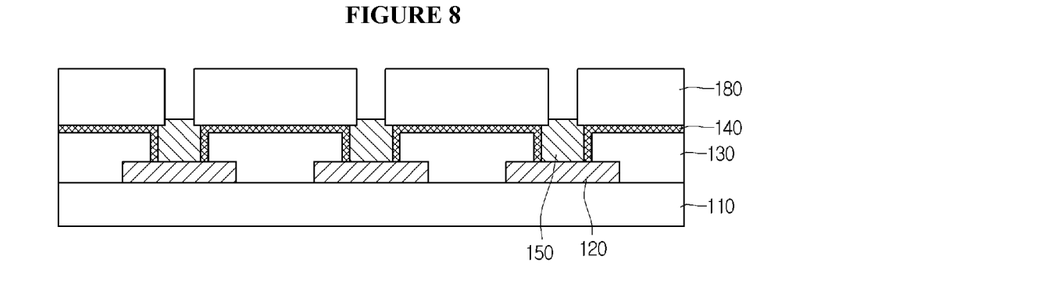

Next, the bump connection 150 is formed on the pad 120 as shown in FIG. 8.

That is, the alloy containing the conductive material, preferably copper is made by an electrolytic plating the plating seed layer 140 as the seed layer to form the bump connection 150 in which a portion of the window 185 of the mask 180.

In this case, the window 185 of the mask 180 has a narrow width than the opening section 135, so that the width of the bump connection 150 is formed to have the narrow width than the solder resist 130.

Figure 9:
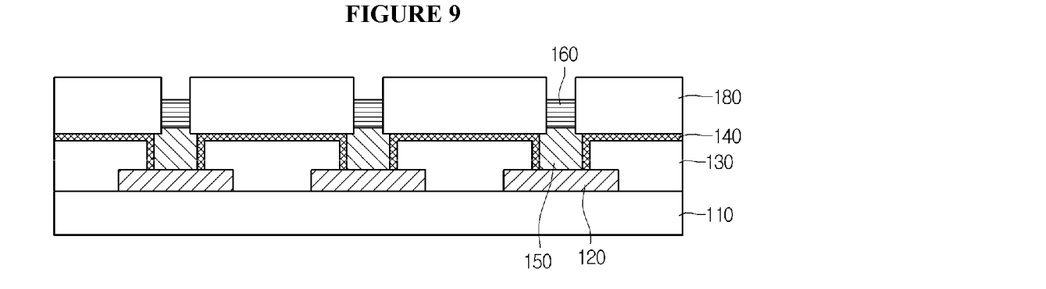

Next, as shown in FIG. 9, the bump 160 is formed on the formed bump connection 150.

That is, the electrolyte plating is performed on the ally containing the conductive material preferably copper.

In this case the bump 160 is formed to have the narrow width than the width of the opening section 135 included in the solder resist 130.

That is, since the bump 160 is formed by filling the window 185 having a narrow width than the width of the opening section 135, it is formed as a narrow width than the width of the opening section 135.

In addition, the bump 160 is determined in shape thereof depending on the pattern of the window 185 formed in the mask 180.

In this case, the pattern of the window 185 has a square pillar shape.

Figure 10:
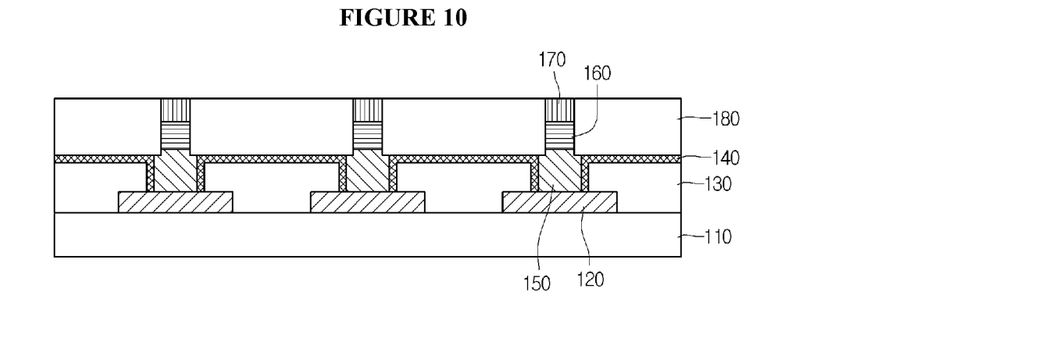

Next, the solder 170 is formed on the bump 160 as known in FIG. 10.

The solder 170 may be formed to fill the entire window 185 of the mask 180.

In addition, the solder 170 reflows and melted to have the round shape by the surface tension to contact with the components.

The solder 170 includes more than binary metal and the binary metal is alloy containing Sn, specifically, an alloy containing Sn—Cu.

Figure 11:
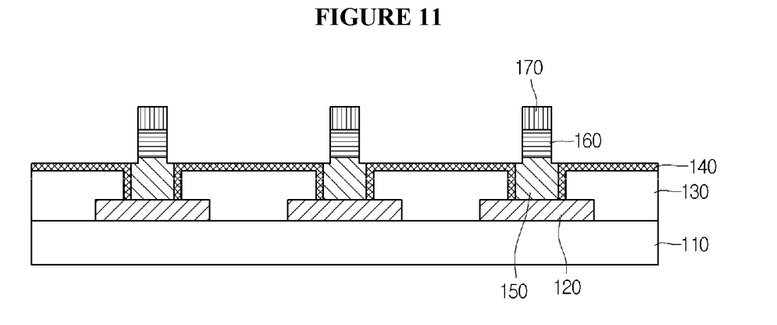

Next, the mask 180 formed on the plating seed layer 140 is removed, that is, the mask 180 is peeled to expose the bump 160 and solder 170 as shown in FIG. 11.

Figure 12:
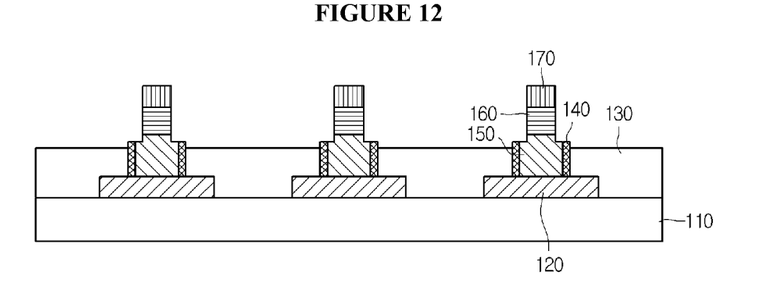

Subsequently, as shown in FIG. 12, the formed plating metal seed layer 140 is etched and removed.

More preferably, the plating seed layer formed in the surface of the solder resist 130 is selectively etched, so that the upper surface of the solder resist 130 is exposed.

Figure 13:
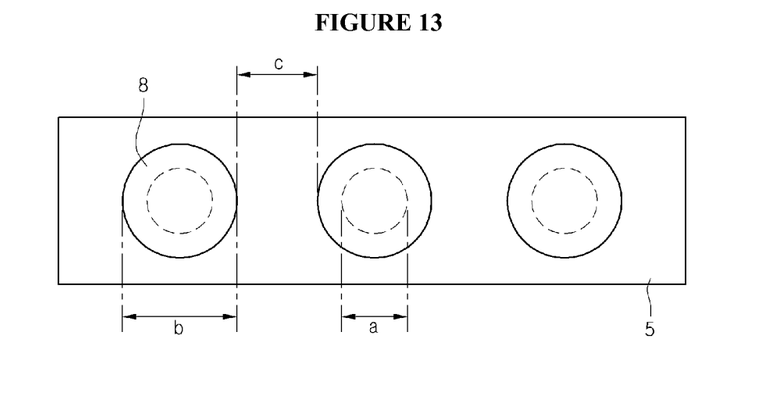
FIG. 13 is a plan view of a printed circuit board according to the prior art.
Figure 14:
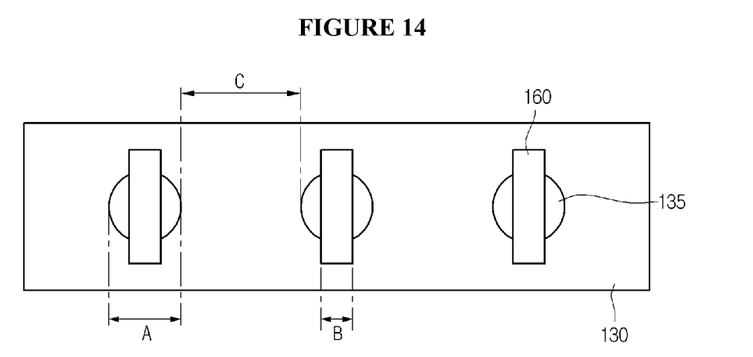
FIG. 14 is a plane view according to an embodiment of the present invention.

FIG. 13 is a plan view of the print circuit board according to the prior art and FIG. 14 is a plan view of the printed circuit board 100 according to the present invention.

Referring to FIG. 13, in the printed circuit board 1, the opening section is formed at the solder resist 5 and the bump 8 covering the entire opening section is formed.

On the other hand, in the printed circuit board 1, the width b in the bump 8 is formed to be greater than the width of the opening section in the solder resist 5.

As a result the printed circuit board 1 has an interval of c and the bump 8 is formed in succession.

However, referring to FIG. 14, in the printed circuit board 100, the opening 135 is formed in the solder resist and the bump 160 covering a portion of the opening section 135 toward the side of the opening 135.

In the other hand, in the printed circuit board 1, the width b in the bump 160 is formed to be narrow than the width A of the opening in the solder resist 130.

Therefore, the printed circuit board 100 has an interval of C and the bump 160 is continuously formed.

At this time, in the printed circuit board 100 according to the present invention, A is great than B, in the printed circuit board 1 according to the prior art, a is narrow than b, so that the printed circuit board 100 has the internal C greater than c having the printed circuit board 1 and the bump 160 is continuously formed.

Figure 15:
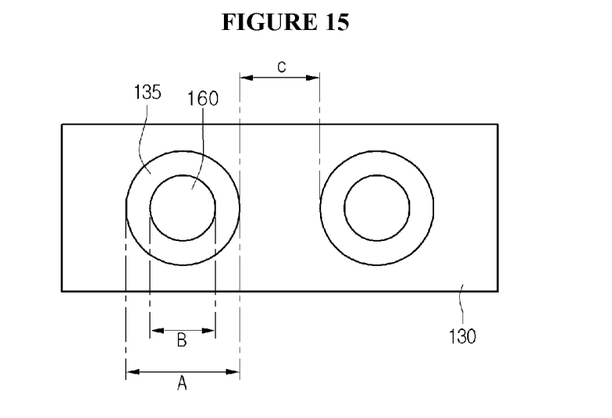
FIG. 15. is a plane view of the printed circuit board according to another embodiment of the present invention.

FIG. 15. is a plane view of the printed circuit board according to another embodiment of the present invention.

On the other hand, referring to FIG. 15, the print circuit board 100 according to the present invention has a protective layer formed with opening section and the bump 160 covering only a portion of the opening section 135 is formed toward an inner side of the opening section.

Figure 16:
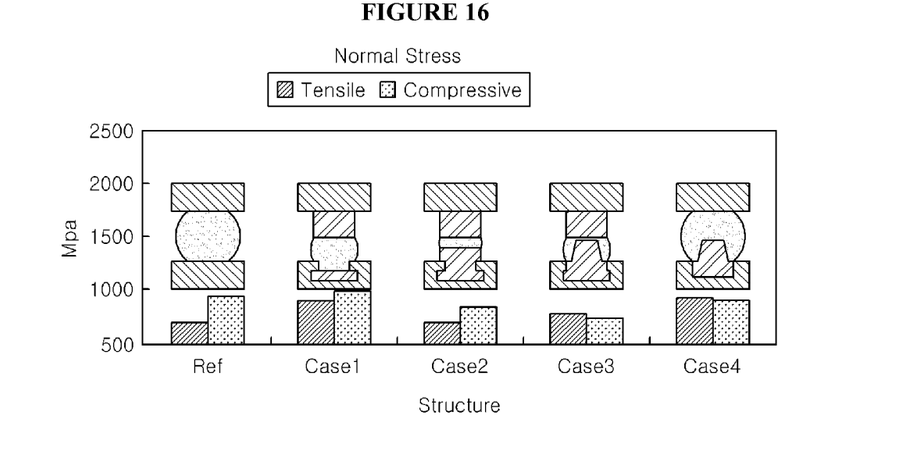
FIGS. 16 and 17 shows a reliability evaluation of the printed circuit board according to the embodiment of the present invention.
Figure 17:
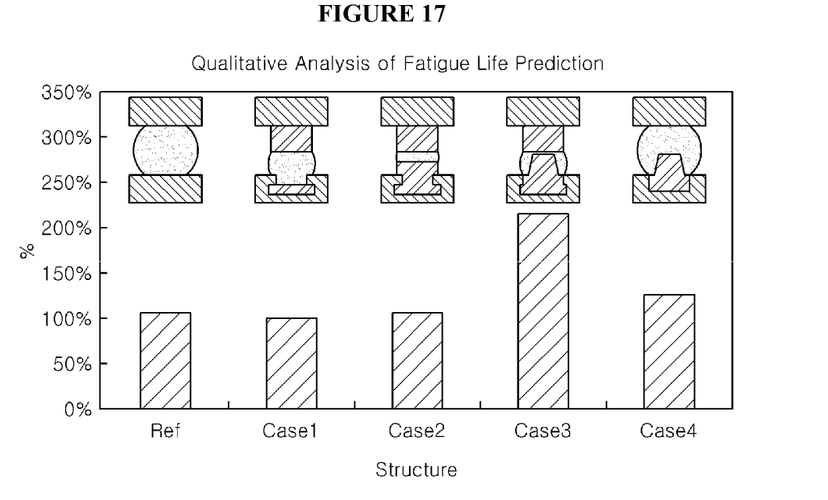

FIGS. 16 and 17 shows a reliability evaluation of a printed circuit according to the embodiment of the present invention.

Referring to FIG. 16, a structure of Case 3 shows the overall height reliability based on a simulation evaluation result according to the bump structure. When chip and the bond are bonded by the bump structure 160, a street applied to a die will be reduced.

In addition, referring to FIG. 17, the case 3 structure has the best life cycle based on bump crack analysis result.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A printed circuit board comprising;
   an insulating layer;
   a pad formed on the insulating layer;
   a solder resist formed on the pad and having an opening section exposing an upper surface of the pad;
   a bump connection section on the pad and filling the opening section of the solder resist;
   a plating seed layer between an inner wall of the solder resist and a side surface of the bump connection section; and
   a bump formed on the bump connection section, having a first portion protruded from an upper surface of the solder resist at a predetermined height,
   wherein the first portion of the bump has a narrower width than the opening section of the solder resist.

2. The printed circuit board of claim 1, wherein an upper surface of the bump connection section has a narrower width than a lower surface of the bump connection section.

3. The printed circuit board of claim 1, wherein the bump connection section protrudes from the upper surface of the solder resist.

4. The printed circuit board of claim 3, wherein the bump is formed narrower than the width of a lower surface of the bump connection section.

5. The printed circuit board of claim 3, wherein
   a lower surface of the bump is higher than an upper surface of the plating seed layer.

6. The printed circuit board of claim 3, wherein the bump connection section is formed such that a width of an upper surface thereof and a lower surface opposite the upper surface is different.

7. The printed circuit board of claim 3,
   wherein the bump is not in direct contact with the plating layer.

8. The printed circuit board of claim 7, wherein the solder is formed such that a width of an upper surface thereof and a lower surface opposite the upper surface is same.

9. The printed circuit board of claim 7, wherein a width of a lower surface of the solder is same as a width of an upper surface of the bump.

10. The printed circuit board of claim 1, wherein the plating seed layer protrudes from the upper surface of the solder resist.

11. The printed circuit board of claim 1, wherein the bump is formed such that a width of the upper surface thereof and a lower surface opposite the upper surface is equal.

12. The printed circuit board of claim 1, wherein the bump is a cylinder pillar, a square pillar and a polygonal pillar in shape.

13. The printed circuit board of claim 1, wherein the bump is made of alloy containing copper.

* * * * *